US005394116A

United States Patent [19]

Kasturia

[11] Patent Number: 5,394,116

[45] Date of Patent: Feb. 28, 1995

[54] FRACTIONAL PHASE SHIFT RING OSCILLATOR ARRANGEMENT

[75] Inventor: Sanjay Kasturia, Middletown, N.J.

[73] Assignee: AT&T Corp., Murray Hill, N.J.

[21] Appl. No.: 175,073

[22] Filed: Dec. 29, 1993

[51] Int. Cl.[6] ........................ H03B 5/02; H03B 27/00; H03L 7/099; H03L 7/18

[52] U.S. Cl. ........................................ 331/34; 331/45; 331/57; 331/60; 331/177 R

[58] Field of Search ................. 331/34, 57, 177 R, 45, 331/60

[56] References Cited

U.S. PATENT DOCUMENTS 5,059,924 10/1991 JenningsCheck ................. 331/57 X
5,126,691 6/1992 Mijuskovic et al. .............. 331/45 X
5,233,316 8/1993 Yamada et al. ....................... 331/45

*Primary Examiner*—Siegfried H. Grimm

[57] ABSTRACT

A ring oscillator has a plurality of oscillator outputs, each of which carries an oscillating signal of a given frequency and thus repetition period but with a phase shift of a predetermined fraction of the repetition period from any one of the oscillator outputs to a next oscillator output in a predetermined repetitive sequence. The inputs of a selector are each connected to a respective one of the oscillator outputs. The selector includes a number of individually actuatable selector switches that are so actuated as to establish a connection between the selector output and only any selected one of the selector inputs at any time. The actuation is accomplished in a first mode, in which the selector switches maintain the connection, or in a second mode in which the selector switches intermittently index the connection in the predetermined repetitive sequence among the selector inputs.

10 Claims, 4 Drawing Sheets

FRACTIONAL PHASE SHIFT RING OSCILLATOR ARRANGEMENT

FIELD OF THE INVENTION

The present invention relates to oscillator arrangements in general, and more particularly to an oscillator arrangement with variable output frequency, which is especially suited for use in telecommunications circuits as a highly accurate frequency source with an extremely low noise generation characteristic and a very rapid response to changing requirements for its output signal frequency.

BACKGROUND OF THE INVENTION

A need exists in various fields of human endeavor for an oscillator arrangement that can be rapidly tuned to any desired frequency within its operating range with a high degree of accuracy that is to be maintained for as long as required. This need is particularly pronounced in the telecommunications field, especially in the cellular and cordless telephone system areas where frequency lock between the transmitter and the receiver, or accurate tuning of both transmitter and receiver to the very same frequency which more often than not differs from one communication event to the next, is crucial for establishing quality transmission between such telecommunications devices. Therefore, the transmitter and the receiver of such systems must be equipped with oscillator arrangements that are either very stable, or capable of changing their frequency and/or phase in unison, and preferably both. Such synchronization is becoming more and more critical in view of the current trends of increased transmission rates, reduced spacings between adjacent carrier frequencies, and the use of signal multiplexing, data compression and/or other techniques in an attempt to satisfy the ever-increasing demand for services despite the limited nature of the available transmission spectrum.

An approach that is currently being used for controlling the output frequency of a variable frequency oscillator, such as a voltage controlled oscillator, in a phase-locked relationship to an oscillating input (reference) signal is to interpose an integer divider into a feedback loop between the oscillator output and a phase detector that also receives the input signal and issues a control or error signal indicative or discrepancies between the phases of the two signals. This error signal is then supplied, after being processed in a loop filter and amplifier, to a control input of the oscillator to control the operation (i.e. the oscillation frequency) of the oscillator. The phase detector operates on the edges of its input signals—that is, it detects the lead/lag relationship between such edges and issues a corresponding error signal. As a result, the oscillator output frequency is maintained at a level N times the input reference signal frequency $F_r$, where N is the integer by which the integer divider divides the output signal of the oscillator.

Experience with oscillator arrangements of this type has shown that some of the signal at the incoming signal frequency $F_r$ leaks through the oscillator arrangement to its output. This $F_r$ leakage produces modulation sidebands in the output signal of the voltage controlled oscillator. To eliminate or at least minimize interference or crosstalk between communication channels, most cellular/cordless telephone systems require that the power carried by such sidebands, commonly called reference sidebands, be at least 50 to 60 dB below that of the carrier. This typically requires that the loop bandwidth $F_{bw}$ of the oscillator arrangement or synthesizer be maintained at less than about one-tenth of the incoming signal frequency—i.e. below 0.1 $F_r$. Now, in this particular construction, the frequency step size $F_{step}$ at the output of the oscillator is also equal to $F_r$, so that the ratio of the loop bandwidth $F_{bw}$ and the frequency step size $F_{step}$ typically amounts to 0.1. Increasing the order of the loop filter in the synthesizer would permit an increase in the loop bandwidth $F_{bw}$ without degrading the reference sideband suppression; however, this would also reduce the phase margin of the loop and would offer, at best, a relatively small improvement (e.g. a factor of 2 or 3). Consequently, any significant increase in the $F_{bw}$:$F_{step}$ ratio would, in accordance with the prior art, require the use of multiple phase locked loops. Obviously, that would be a very cumbersome and expensive proposition to adopt.

OBJECTS OF THE INVENTION

Accordingly, it is an object of the present invention to avoid the disadvantages of the prior art.

More particularly, it is an object of the present invention to provide an oscillator arrangement that can be quickly and easily tuned with a high degree of precision to any desired frequency, with respect to its output signal, and maintained at this chosen frequency for as long as needed.

Still another object of the present invention is to construct an oscillator arrangement of the type here under consideration in such a manner as to minimize the amount of power carried in sidebands of the desired carrier to an acceptable level that does not adversely affect communications in other, even very closely adjacent, communications channels.

A concomitant object of the invention is to devise an oscillator arrangement of the above type that is relatively simple in construction, inexpensive to manufacture, easy to use, and reliable in operation.

SUMMARY OF THE INVENTION

In keeping with these objects, and others that will become apparent hereafter, one feature of the present invention resides in a variable output oscillator arrangement that includes a ring oscillator having a plurality of oscillator outputs. The ring oscillator generates an oscillating signal of a given frequency and thus repetition period, and presents it to the oscillator outputs with a phase shift of a fraction of the repetition period from any one of the oscillator outputs to a next one in a predetermined repetitive sequence. The oscillator arrangement of the invention further includes a selector that has a plurality of selector inputs, each of which is connected to one of the oscillator outputs, and a selector output. The selector additionally includes a number of individually actuatable selector switches that are interposed between the selector inputs and the selector output. There is further provided means for actuating the selector switches in such a manner as to establish a connection between the selector output and only a selected one of the selector inputs at any time, means for operating the actuating means in response to a control signal in one of two modes—in one of which the selector switches maintain the connection and in the other of which the selector switches intermittently index the connection in the predetermined repetitive sequence among the selector inputs—and means for furnishing the control signal to the operating means to select that of the two modes in which the actuating means is to then operate.

The novel features which are considered as characteristic of the invention are more particularly set forth in the appended claims. The improved oscillator arrangement itself, however, both as to its construction and the manner in which it is made and used, together with additional features and advantages thereof, will be best understood upon perusal of the following detailed description of certain specific embodiments with reference to the accompanying drawings.

BRIEF DESCRIPTION OF THE DRAWING

In the drawings, wherein similar reference characters denote like elements throughout the several views.

DETAILED DESCRIPTION OF THE PREFERRED EMBODIMENTS

Figure 1:
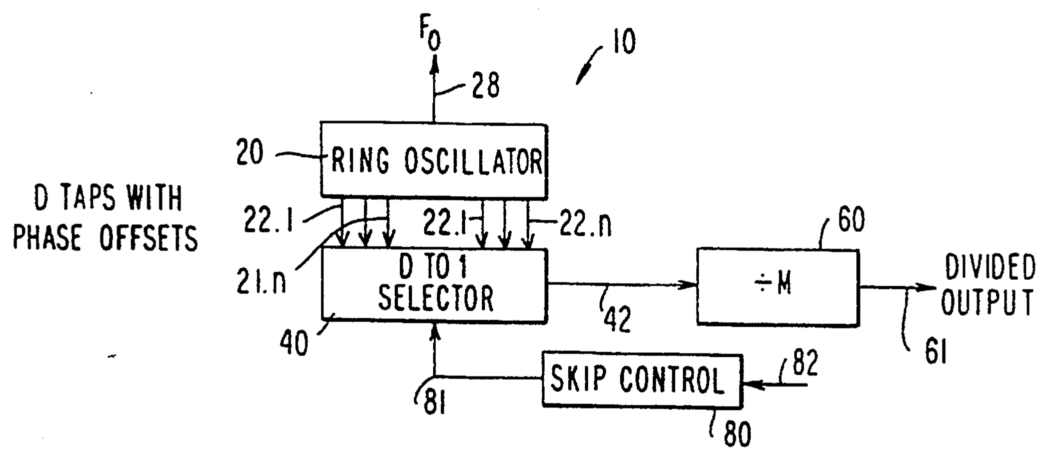
FIG. 1 is a block diagram depicting basic components of an oscillator arrangement in accordance with the present invention.

Referring now to the drawings in detail, and initially to FIG. 1 thereof, the general reference numeral 10 identifies an oscillator arrangement embodying the present invention. As there shown, the oscillator arrangement 10 includes, as its basic components, a ring oscillator 20, a selector 40, a divider 60, and a skip control device 80. The oscillator 20 has a plurality of oscillator outputs identified as 21.1 to 21.*n* and 22.1 to 22.*n* (with n denoting, wherever used throughout the description, an integral number corresponding to that of individual, yet to be discussed, stages of the oscillator 20). These oscillator outputs 21.1 to 22.*n* are individually connected to corresponding inputs of the selector 40, as will also be discussed below. The selector 40 has a skip control input that is connected to an output 81 of the skip control device 80, and an output 42 that is connected to an input of the divider 60. The divider 60 is constructed as an integer divider having an output 61 on which there appears a divided output signal while the arrangement 10 is in operative use. The skip control device 80 also includes a control input 82 for receiving a control signal that controls the mode of operation of the skip control device 80.

Figure 2:
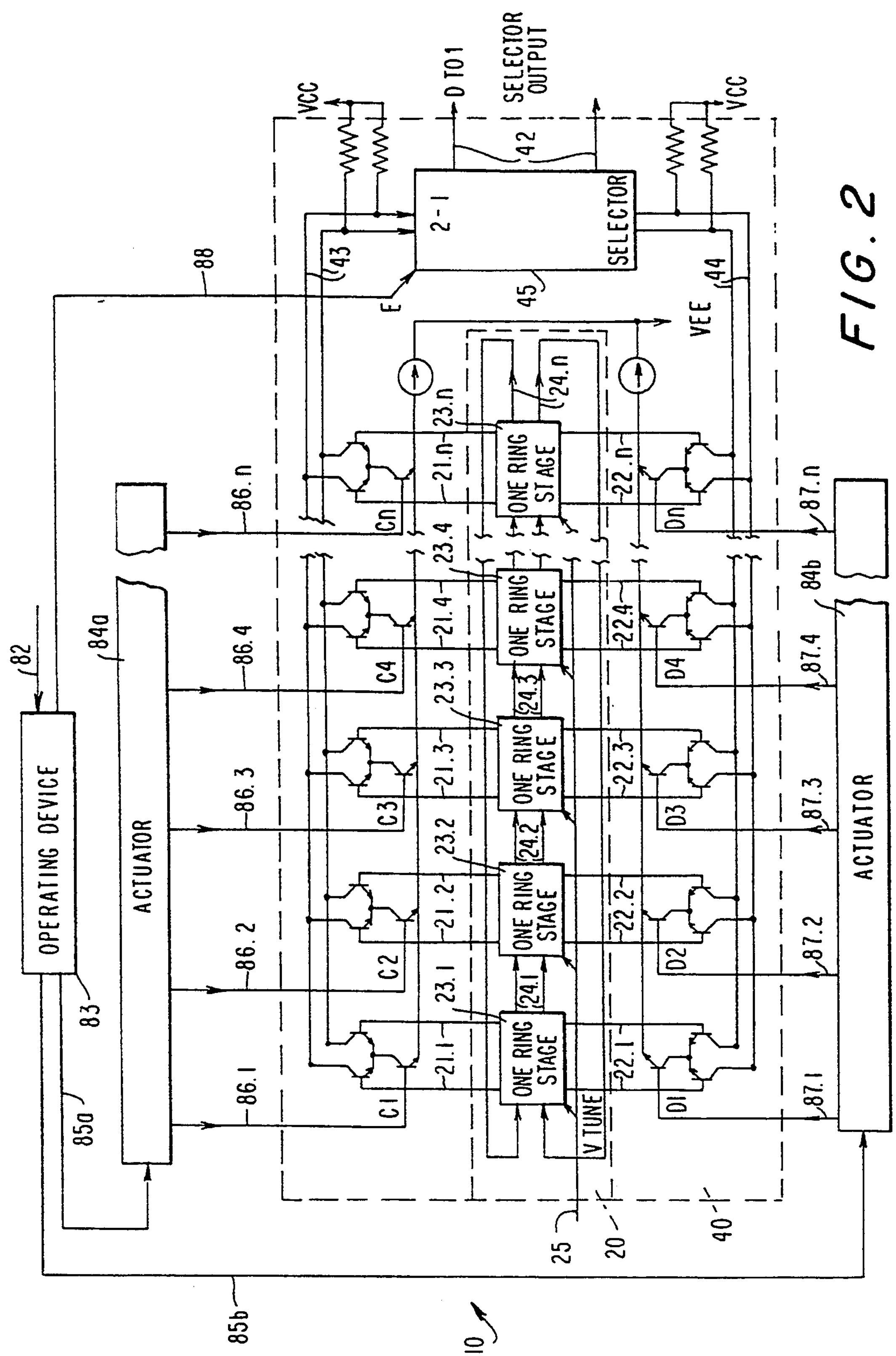
FIG. 2 is a circuit diagram of an embodiment of a ring oscillator including a plurality of stages, and of associated selector circuitry, which may be used to advantage in the oscillator arrangement of FIG. 1 and others hereinafter described.
Figure 3:
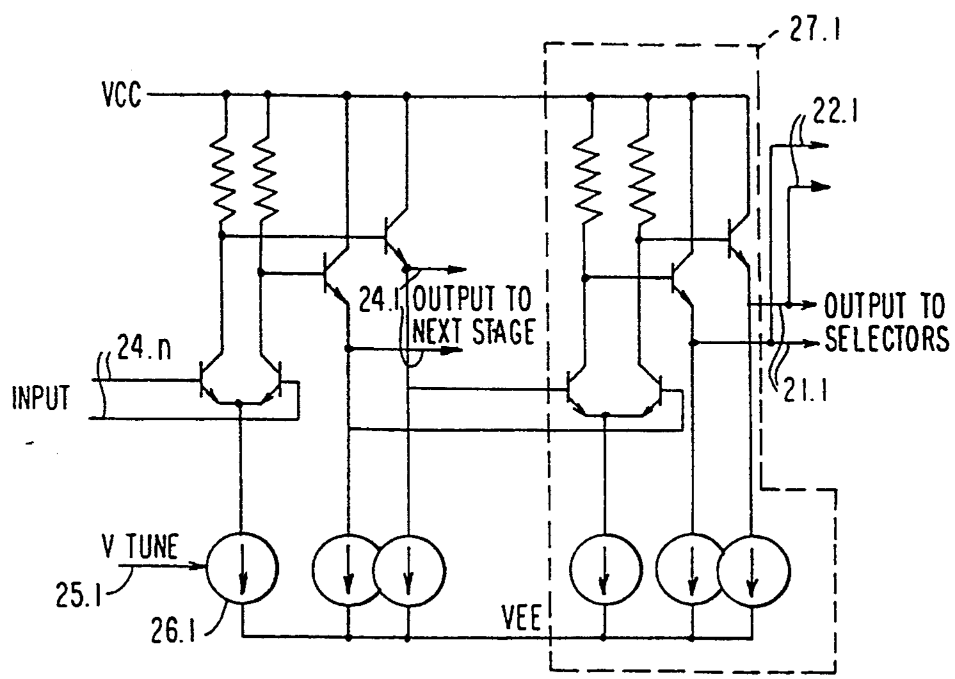
FIG. 3 is a circuit diagram of any one of the stages of the ring oscillator of FIG. 2.
Figure 4:
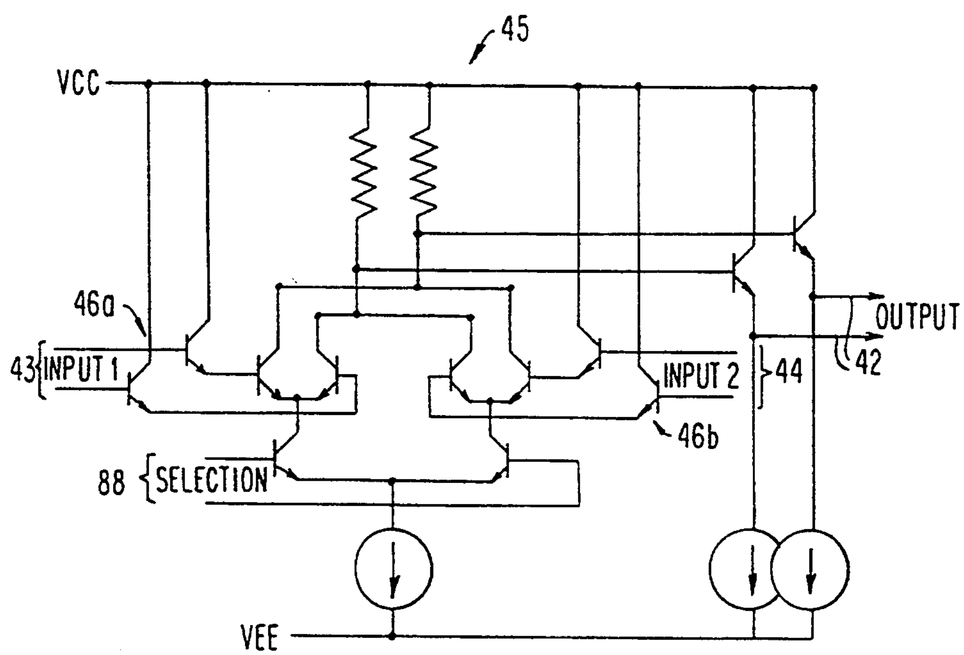
FIG. 4 is a circuit diagram of a selector for use as a part of the selector circuitry of FIG. 2.

Further details of the arrangement 10 of FIG. 1 (and also of FIGS. 5 to 7 that incorporate the basic arrangement of FIG. 1) will become apparent from consideration of FIGS. 2 to 4 of the drawings and the following description thereof. As shown in FIG. 2, the ring oscillator 20 proper has a plurality of stages 23.1 to 23.*n* to which reference has previously been made. It has been found to be especially advantageous, if not indispensable, for the number n of the stages 23.1 to 23.*n* to be an odd number, such as five. The oscillator stages 23.1 to 23.*n* have the respective aforementioned oscillator outputs 21.1 to 21.*n* and 22.1 to 22.*n*.

In this connection it is to be mentioned, also for the purpose of identical interpretation in similar circumstances hereafter, that each of the outputs 21.1 to 21.*n* and 22.1 to 22.*n* actually has two leads (that are not separately identified in order to not unduly encumber the drawing). This is so because, as will be readily apparent to those familiar with electronic circuitry, the oscillator arrangement 10 operates on a differential output signal principle. This means that the actual output signals from (and, by the same token, input signals to) the oscillator stages 23.1 to 23.*n* (and to and from the various additional components to be described below) are the differences between the electric potentials appearing on the respective associated lead lines (of the outputs 21.1 to 21.*n* and 22.1 to 22.*n*, etc.). This results in the advantage that influences, especially disturbances, that affect both of the associated lines in the same or similar manner will, for all intents and purposes, cancel each other out insofar as the magnitude and/or phase of the output (or input) signal.

Obviously, for this approach to operate properly the signals appearing on the respective associated lines should be complements of one another—that is, one of them should be "high" while the other is "low", and vice versa. For this reason, the circuitry described below employs parallel branches for each function to be performed, such branches having identical structures but one being controlled by the respective signal and the other by its complement. Once it is recognized anti appreciated that the circuitry utilizes this feature throughout, its structure and operation will be readily understood from the drawings alone, without the need to explain or describe the same in necessary detail. Consequently, the following description of the disclosed circuitry will go into detail only as needed for understanding its operation.

As a comparison of FIGS. 1 and 2 will reveal, the outputs 21.1 to 21.n and 22.1 to 22.*n* are connected, on a one-to-one basis, with corresponding (but not separately numbered) associated inputs of selector switches C1 to Cn, and D1 to Dn, respectively, of the selector 40. As shown, each of the switches C1 to Cn and D1 to Dn includes three transistors, this structure and its operation being so well known as to not require timer elaboration. Suffice it to say that (binary) signals supplied to the switches C1 to Cn and/or D1 to Dn through respective control lines 86.1 to 86.*n* or 87.1 to 87.*n* cause each of such switches C1 to Cn and D1 to Dn to assume one of its open and closed states, thus interrupting or establishing connections between the respective associated oscillator outputs 21.1 to 21.*n* or 22.1 to 22.*n* and the respective outputs 43 or 44, respectively. The outputs 43 and 44 then lead to a two-to-one selector 45 that determines, on the basis of a control signal supplied to its input E through a control line 88, which of the outputs 43 and 44 is to be connected, to the exclusion of the other, to the selector output 42.

Additional details of the ring oscillator 20 are revealed in FIG. 3 of the drawing. As there illustrated with respect to the oscillator stage 23.1, each such stage 23.1. to 23.*n* has an output 24.1 to 24.n (see FIG. 1) that is connected to a corresponding input of the oscillator stage 23.2 to 23.n, 23.1 that follows next in the repetitive or cyclical oscillator stage sequence. Thus, in the situation illustrated in FIG. 3, the output 24.1 of the stage 23.1 is connected to the corresponding input of the stage 23.2, whereas the output of the stage 23.*n* is connected to the corresponding input of the oscillator stage 23.1. Because of this connection of the stages 23.1 to 23.*n* in a ring, and because of the delays inherent in the operation of transistors and similar elements, the oscillator 20 will settle into operation at a given frequency after power-up. The exact value of such frequency can be set, within limits but with a high degree of precision, by supplying a tuning voltage $V_{tune}$ first in common through a line 25 and then individually through branch lines (such as 25.1 shown in FIG. 3) to respective controllable transistors (such as 26.1 of FIG. 3), each of which controls the flow of the electric current through the branch or branches in which it is interposed. This current flow control, in turn, determines the rise and fall times (slopes) of the signals supplied to respective transistors that control the timing of the signals supplied to the respective outputs 24.1 to 24.*n* connected to the associated inputs of the next following oscillator stages 23.2 to 23.*n*, 23.1, and thus the oscillation period and frequency of the ring oscillator 20, as will be readily appreciated by those familiar with this field.

The output signals appearing at the outputs 24.1 to 24.*n* of the various stages 23.1 to 23.*n* could be supplied directly to the inputs of the associated switches C1 to Cn and D1 to Dn, respectively. However, it has been found to be advantageous to isolate these two types (oscillator and selector) of output signals from one another to a certain degree. To this end, the circuitry of FIG. 3 is shown to further include (as do those of the other stages 23.2 to 23.*n*) an additional selector output circuit 27.1 which is virtually identical, both in structure and operation, to that described above, except that it need not be and thus is not shown as tunable. The transistors of this sub-circuit 27.1 are operated, similarly to what has been described above, in response to the oscillator output signals appearing on the output 24.1, so that they will be time-delayed, complementary replicas of such output signals. These signals or signal replicas are then supplied, as selector output signals, to respective selector outputs 21.1 to 21.*n*. The aforementioned output leads 22.1 are seen to branch off the leads 21.1, in a relationship that is depicted as inverse in the physical sense to indicate that the output signals delivered to the corresponding switches, such as C1 and D1, are complements of one another—as would be those forwarded to the lines 43 and 44 shown in FIG. 1 if such corresponding switches were both closed at the same time. For reasons that will be explained hereinafter, this is not, however, the case.

As previously mentioned, the switches C1 to Cn and D1 to Dn are actuated by signals supplied to them through respective control lines 86.1 to 86.*n* or 87.1 to 87.*n*. These actuating signals are generated, in a synchronized fashion, by an actuator that is shown to have two parts 84*a* and 84*b*. However, it should be understood that the function of such parts 84*a* and 84*b* may, and usually will be, combined, possibly with other functions, in a single device. The construction of actuators of this type is so well known that it need not be discussed here, except to mention that each of the actuator parts 84*a* or 84*b* causes only one of its associated switches C1 to Cn or D1 to Dn to assume its closed (connecting) state or condition at any time, while the remaining ones remain open. Moreover, each actuator part 84*a* or 84*b* is capable of being switched, in response to a control signal appearing on a control line 85*a* or 85*b*, between operations in two modes, in one of which it maintains the electrical connection through the then-closed one of the switches C1 to Cn or D1 to Dn (i.e. it keeps this switch closed and the others open), while in the other it indexes in a predetermined cyclical sequence (corresponding to that of the oscillator stages 23.1 to 23.*n*) through the switches C1 to Cn or D1 to Dn. The control signals appearing on the lines 85*a* and 85*b* are generated by an operating device 83 in response to a mode-switching signal supplied thereto through an input line 82. The operating device 83 also issues a control signal that is supplied trough a control line 88 to the control input E of the two-to-one selector switch 45 to determine whether to connect the selector output 42 with the feed line 43 or the feed line 44.

It will now be appreciated that, because of the aforementioned complementary nature of the signals appearing on the lines 43 and 44, switching of the selector switch 45 would result in 180° phase shift if both of the selector switches, such as C1 and D1, that are associated with one and the same of the oscillator stages 23.1 to 23.*n* were in their closed states at that time. Such a considerable phase shift would introduce undesirable disturbances into the output signal of the selector switch 45. Therefore, the operation of the actuator parts 84*a* and 84*b* is synchronized or coordinated by the operating device 83 to assure that, especially during operation in the other or indexing mode, the phase shift introduced by switching of the selector switch 45 will be the same as that encountered during switching between or indexing through the switches C1 to Cn, on the one hand, or D1 to Dn, on the other. The manner in which this is carried out or implemented is well known to those skilled in the art and need not, therefore, be discussed herein.

One possible, and advantageous, construction of the selector switch 45 is illustrated, by way of example, in FIG. 4 of the drawing. Here again, the circuit diagram is, by and large, self-explanatory so that no detailed description need be provided. Suffice it to say that, in response to the control signal coming from the line 88 (once more illustrated as a double line carrying a differential signal), the output signal appearing on the selector output 42 will be either that passing through a transistor circuit 46*a* in response to signals arriving from the line 43 (to input 1) or through a transistor circuit 46*b* in response to signals arriving from the line 44 (to input 2). Inasmuch as the signals appearing on the two leads of the control line 88 are complements of one another, at any given time the signal resulting from the operation of one of the switches 46*a* and 46*b* will be passed through to the selector output 42 while the other is discarded, and vice versa. It will be realized that, owing to the complementary nature of the signals appearing on the outputs 21.1 to 21.*n* and 22.1 to 22.*n* of the stages 23.1 to 23.*n*, the number of different phase shifts of the oscillator signal that are available from the ring oscillator 20 is double that of the various oscillator stages 23.1 to 23.*n*, i.e. 2*n*. Each of these phase shifts, including those occurring on switching between the lines 43 and 44, is merely a fraction of the oscillator signal period. Of course, all such fractions should ideally (and preferably) have identical values, such that each oscillator signal period is subdivided into 2*n* intervals of equal length and of thus identical phase shifts relative to one another in the sequence in which the sequential indexing is carried out.

Now that the construction of the oscillator arrangement 10 of the present invention has been discussed in some detail, its operation will be described, once more in terms of the environment depicted in FIG. 1 of the drawings. The ring oscillator 20 generates the aforementioned oscillator signal at a frequency $F_o$ (as indicated at 28). In addition thereto, signals of the same frequency $F_o$, but staggered or offset in phase by the aforementioned fraction of the oscillating signal period, are presented at the $D=2n$ oscillator outputs or taps 21.1 to 21.*n* and 22.1 to 22.*n* and are hence supplied to the respective associated inputs of the selector 40. As alluded to before, the skip control device 80 controls the selector 40 through a line 81 which, in reality, embraces the lines 86.1 to 86.*n*, 87.1 to 87.*n*, and 88 of FIG. 2. The control exercised by the device 80 is such as to cause the selector 40 to operate in one of its two modes —i.e. maintaining the then-existing connection or indexing in the given sequence through the taps 21.1 to 21.*n*, 22.1 to 22.*n*. This means that the output signal appearing on the output 42 will have the same period as (but more than likely a different phase than) the oscillator output signal appearing on the output 28 when operating in the first mode. On the other hand, whenever the skip control device 80 brings about indexing by one step, in response to the signal appearing on the input 82, the aforementioned fraction will be added to (or subtracted from, depending on the sense of indexing) the respective period during which such indexing occurs. The affected period will therefore be longer (or shorter) by such fraction and, if the indexing takes place once during every consecutive period occurring during a predetermined time interval, the frequency appearing at the output 42 during such interval will initially be commensurately lower (or higher) than the frequency $F_o$ appearing on the output 28. This frequency is then divided by M in the divider 60—only every M-th signal appearing at the input of the divider 60 will cause issuance of a signal to the output 61. The end result is that the signal issued to the output 61 of the divider 60 occurs at a frequency of $F_o/M$, or $F_o/(M+1/D)$, for example, depending on which of the aforementioned modes of operation is chosen. This is applicable in a situation in which the "skip" pulse issued by the skip control device 80 causes the selector 60 to intermittently switch its output from its input i (where $i=1, 2 \ldots 2n$, in sequence) to its input $i+1$. This is done modulo D so that, if $i=D-1$, then $(i+1)$ is mapped to the output 42. Inasmuch as the $(i+1)$ output signal is delayed from the i input by 1/D of a period or cycle of $F_o$, the output signal from the divider 60 is indeed at the frequency $F_o/(M+1/D)$, with no residual phase modulation. In this context, it should be understood that D cycles of the divided output require MD cycles of $F_o$ when no "skipping" occurs, as compared to $MD+1$ cycles needed with the "skipping" feature in effect. This provides an option of dividing $F_o$ either by an integer (M), or a compound fraction $(M+1/D)$.

Circuit simulations of a five-stage ring oscillator arrangement akin to that shown in FIG. 2 of the drawing using a high performance (12 GHz) silicon bipolar process have indicated that a GHz circuit may be implemented using approximately 10 mA at 5 volts. As previously mentioned, the five-stage oscillator used in this implementation provided phase offsets of one-tenth of a period, so that D equals 10 and n equals 5. This is made possible by using the outputs of the ring oscillator gates, as well as their complements, in the manner described hereinabove. Of course, these complements are available because the ring oscillator gates are differential.

The ring oscillator arrangement 10 of FIG. 1 may be operated as a variable frequency oscillator (or voltage controlled oscillator, VCO) if the delay of each gate in the oscillator ring is variable, such as in the manner explained above. In the case of an ECL or CML ring oscillator, the gate delay can be varied by varying the tree current in each differential pair or by changing the reverse bias on a diode, as is well known.

Figure 5:
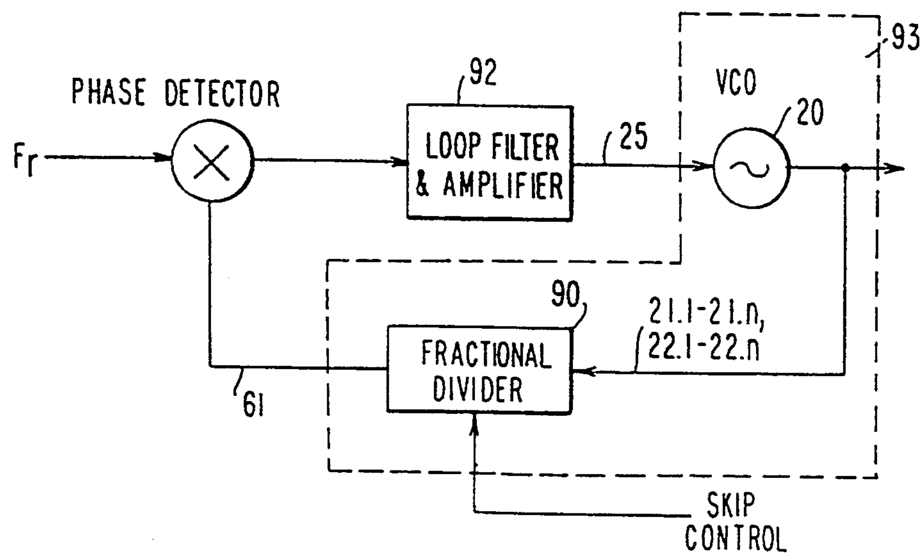
FIG. 5 is a block diagram depicting one possible use of the oscillator arrangement of FIG. 1 in an oscillator frequency control feedback situation.

A particularly advantageous use of the principles and apparatus herein described is revealed in FIG. 5 of the drawing, in which the reference numeral 90 denotes a fractional divider of the type discussed, i.e. one embracing the components 40, 60 and 80 described in conjunction with FIG. 1, and the various lines connecting the same. The output line 61 carrying the divided output signal of the fractional divider 90 is connected to one input of a phase detector 91 of a known construction, while a reference signal of a frequency $F_r$ is fed to another input of the phase detector 91. The detector 91 compares the phases of the incoming signals and issues an error signal indicative of the phase difference (lag/lead relationship) between such input signals. This error signal is then supplied, after having been passed through and modified in a loop filter and amplifier 92, also of known construction, to the ring oscillator 20 as the aforementioned tuning or frequency control signal carried by the line 25 and its branches 25.1 to 25.*n*. The signal supplied to the fractional divider 90 through the line 82 is a binary signal having a binary value of "0" indicative of operation in the "maintaining" mode and a binary value of "1" representing operation in the "indexing" mode. The switching of this signal between its two binary values or states determines for how many cycles the fractional divider 90 operates as an integer divider, and for how many cycles it operates as a true fractional divider. This "split" determines the effective frequency that is being compared with the stable reference frequency $F_r$, and thereby the value of the error signal fed back to the ring oscillator 20, and finally the output frequency $F_o$ of the oscillator 20.

Figure 6:
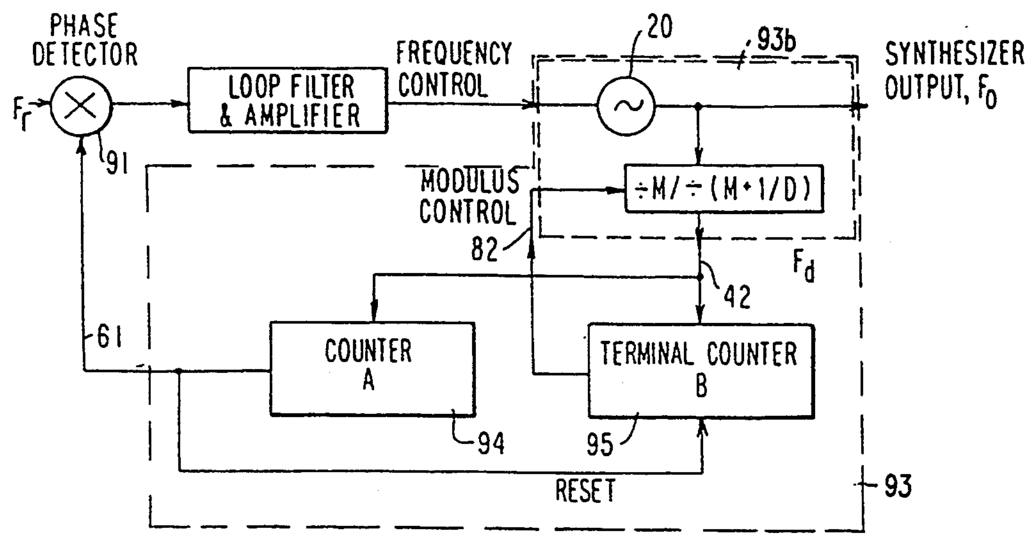
FIG. 6 is a block diagram similar to that of FIG. 5 but showing a modification of the feedback control scheme.

A modified implementation of the feedback control scheme of FIG. 5 is depicted in FIG. 6 in which a block 93 corresponds to the like-numbered block of FIG. 5. In addition, the arrangement shown in FIG. 6 includes two counters 94 and 95, also identified as counter A and terminal counter B, respectively. The counters 94 and 95 both receive the divided output issuing from the block 93 with a frequency $F_d$, so that each counts the number of pulses received until its pre-set count is reached. The output of the counter 95 supplies a binary signal to the "skip" or modulus control line 82, whereas the output of the counter 94 is supplied to the line 61, as well as to a reset input of the terminal counter 95.

This FIG. 6 embodiment of the invention operates as follows. At the start of a cycle, the output signal of the counter 94 (i.e. the modulus signal) is set to binary "0", the counter 94 is set to a count $(A-1)$, and the counter 95 is set to a count $(B-1)$, where A and B are different selected integers with $A \geqq B$. Both of the counters 94 and 95 count down with each received pulse, being thus clocked by $F_d$. When counter B reaches 0, the modulus control on line 82 is set to binary "1", and the counter 95 stops counting until reset by the output signal of the counter 94. Consequently, when the loop is locked, the following conditions prevail:

$$F_o = F_r((A-B)M + B(M+1/D)) = F_r(AM + B/D)$$

Because of the fractional multiplier, $F_o$ call be adjusted in steps of $F_r/D$. To obtain a consecutive series of channel frequencies with this step size, it is necessary to be able to keep B/D as large as M−1/D, or B as large as D(M−1/D). Because A≧B, $F_o$ can attain a lock at frequencies exceeding $F_r$DM(M−1/D). This limits the maximum usable value of M for a given application. Nevertheless, a larger value of M may sometimes be desired so as to reduce power consumption by reducing the clock rate of the counter circuits that follow the high speed divider.

Figure 7:
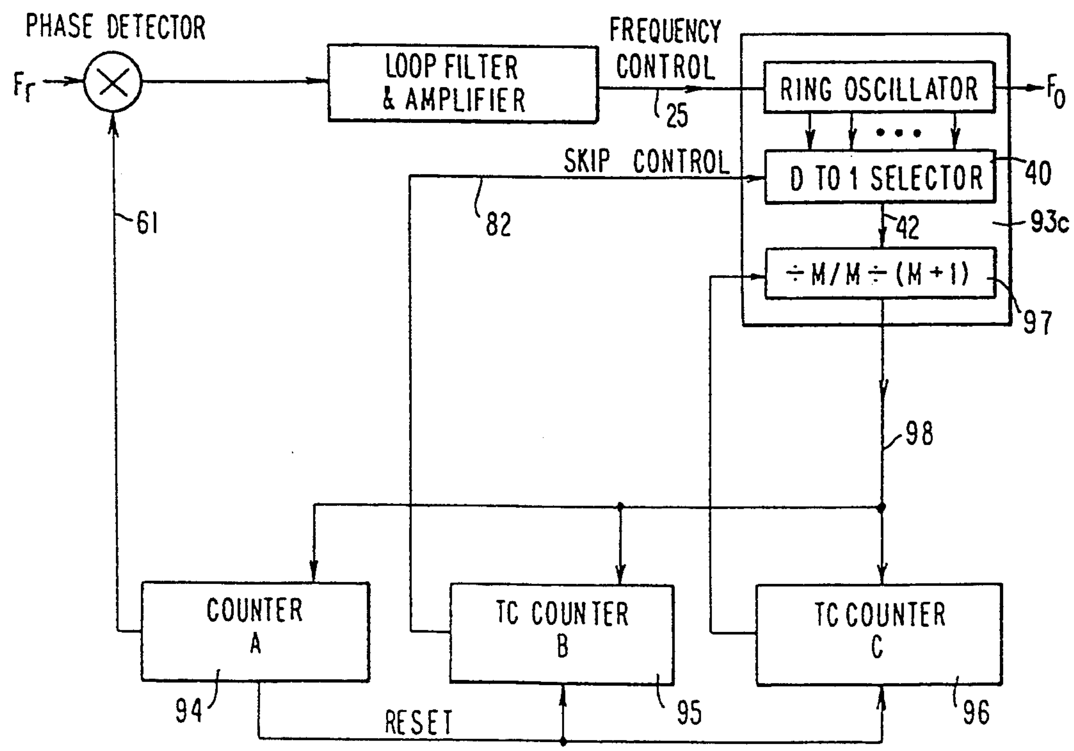
FIG. 7 is a block diagram similar to those of FIGS. 5 and 6 but showing a further modification of a feedback control scheme in accordance with the invention.

FIG. 7 of the drawings discloses an oscillator arrangement that is further modified with a view toward achieving this goal. As shown in FIG. 7, there is provided an additional counter 96, identified as the TC counter C, in addition to the counters 94 and 95. The block 93 includes, instead of the divide-by-M divider 60 of FIG. 5, an integer divider 97 that is switchable between divide-by-M and divide-by-(M+1) modes. The output signal of this divider 97 is supplied to the inputs of all of the counters 94, 95 and 96 so that the pulses of this output signal are counted by each of the counters 94, 95 and 96. The output signal (count) of the counter 94 is again used as the reset signal, but this time not only for the counter 95 but also for the counter 96. The output signal of the counter 95 again controls the operation of the selector 40, in the manner discussed above, while the output signal of the counter 96 is used to switch the integer divider from its one (divide-by-M) mode to the other on reaching the count.

With these modifications, the above-described analysis changes as follows. B/D must now be capable of being kept as large as (1−1/D), which means that B must be capable of being as large as D(1−1/D)=D−1. Furthermore, the count C of the counter 96 must be allowed to be as large as M−1. This means that $F_o$ must be greater than approximately $F_r$(M +D−2)M. More particularly, $$F_o = F_r((A-B-C)M + B(M+1/D) + C(M+1)) = F_{ref}(AM + C + BD)$$

This divider chain divides by M for (A−B−C) cycles, by (M+1/D) for B cycles, and by (M+1) for C cycles.

The only requirements to be satisfied for the FIG. 7 circuitry to work as desired are as follows. The absolute time delay, from an edge of the selected input to the output, should be the same for each input; a change in the selection should produce no spurious transitions on the output; and the change should take effect in less than one period of $F_d$ of the divided output signal.

It has been assumed above that the ring oscillator 20 is ideal in the sense that the output signals from all of the stages 23.1 to 23.*n* are uniformly spaced in phase—that is, that the output signal of the i-th stage lags that of the (i+1)th stage by 1/D of the oscillating period. Yet because of unavoidable variations in device parameters, there will almost always be a non-uniform distribution of the phase differences between the output signals of the various oscillator stages 23.1 to 23.*n*. If the phase lock loop were temporarily broken, on purpose, so as to hold the VCO control constant, the aforementioned phase variation would produce a signal with a fundamental frequency of $F_r/D$ at the phase detector output. This signal would be within the loop bandwidth if the loop is designed for fast switching. Consequently, when the feedback loop is closed, this would result in phase modulation of the VCO with a waveform having a fundamental frequency of $F_r/D$. Assuming further that the loop gain is considerable at $F_r/D$, and that all of the phase modulation is at $F_r/D$, the power in the resulting sidebands must be lower than that of the carrier by $20\log_{10}(\beta/2)$, where $2\beta$ is the peak-to-peak phase deviation from ideal of the tapped outputs 21.1 to 21.*n* and 22.1 to 22.*n* from the ring oscillator 20. For the sideband suppression to exceed 55 dB, which is a typical requirement in many wireless receivers, $\beta$ must be less than 0.0036, corresponding to 0.06% phase "jitter". This may be quite a demanding requirement to meet at high frequencies, and yet not impossible to attain when proper care is taken during fabrication of the device.

While the invention has been illustrated and described as embodied in an oscillator arrangement for use in wireless communications, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of the contribution to the art and, therefore, such adaptations should and are intended to be comprehended within the meaning and range of equivalence of the claims.

What is claimed as new and desired to be protected by Letters Patent is set forth in the appended claims.

1. A variable output oscillator arrangement, comprising:

a ring oscillator having a plurality of oscillator outputs and including means for generating an oscillating signal of a given frequency and repetition period, and means for presenting said oscillating signal to said oscillator outputs with a phase shift of a predetermined fraction of said repetition period from any one of said oscillator outputs to a sequentially next one of said oscillator outputs in a predetermined repetitive sequence;

a selector having a plurality of selector inputs each connected to a corresponding one of said plural oscillator outputs, a selector output, and a multiplicity of individually actuatable selector switches interposed between said selector inputs and said selector output;

means for actuating said selector switches so as to establish a connection between said selector output and only a single selected one of said selector inputs at any time;

means for operating said actuating means in response to a control signal in one of two modes, in one of which modes said selector switches maintain said connection and in the other of which modes said selector switches intermittently index said connection in said predetermined repetitive sequence among said plural selector inputs; and means for furnishing said control signal to said operating means to select one of said two modes in which said actuating means is then to operate.

2. The oscillator arrangement as defined in claim 1, wherein presenting means of said ring oscillator is constructed for giving said phase shift of said oscillating signal as presented to each sequentially successive two of said oscillator outputs in said predetermined repetitive sequence substantially the same magnitude.

3. The oscillator arrangement as defined in claim 1, wherein said operating means includes means for detecting, at least while said actuating means is being operated in said other mode, lapse of a predetermined time interval, and for causing said indexing of said connection from a then-closed to a sequentially next subsequent one of said selector switches in response to detection of said lapse of the predetermined time interval.

4. The oscillator arrangement as defined in claim 3, wherein said predetermined time interval corresponds to said repetition period.

5. The oscillator arrangement as defined in claim 1, wherein said ring oscillator includes means for varying said given frequency in response to a frequency control signal; and further comprising a phase detector having first and second detector inputs and a detector output connected to said varying means, means for supplying an oscillating reference signal to said first detector input, and means for connecting said selector output to said second detector input to enable said detector to operatively detect a phase relationship between said oscillating signal and said reference signal and to operatively issue a corresponding error signal to said varying means to constitute said frequency control signal.

6. The oscillator arrangement as defined in claim 1, wherein said furnishing means is operative for giving said control signal a first value indicative of said one mode, and a second value indicative of said other mode and includes means for determining expiration of a predetermined time period since commencement of all operation cycle of the oscillator arrangement and for changing said control signal from said first to said second value in response thereto.

7. The oscillator arrangement as defined in claim 6, wherein said determining means includes first counting means for counting a first number of said repetition periods to determine the duration of said predetermined time period and for effecting the control signal value change in response thereto and second counting means for counting a second number of said repetition periods exceeding said first number to determine the duration of said operation cycle and for issuing a resetting signal for resetting at least said first counting means for the latter to return said control signal from said second to said first value.

8. The oscillator arrangement as defined in claim 7, further comprising means for dividing said oscillating signal appearing at said selector output by a predetermined integer number to obtain a divided output signal.

9. The oscillator arrangement as defined in claim 8, wherein said determining means is connected to said dividing means for receiving said divided output signal.

10. The oscillator arrangement as defined in claim 7, further comprising means for selectively dividing said oscillating signal appearing at said selector output, in response to a selecting signal, by one of a predetermined integer number and said predetermined integer number plus one, to obtain a selected one of two divided output signals; further comprising third counting means for counting a third number of said repetitive periods and for changing said selecting signal from one value corresponding to division by said predetermined integer number to another value corresponding to division by said predetermined number plus one; and wherein said second counting means is further operative for resetting said selecting signal from said other value to said one value substantially simultaneously with said resetting of said first counting means.

* * * * *